United States Patent
Matej et al.

(10) Patent No.: US 11,290,810 B1
(45) Date of Patent: Mar. 29, 2022

(54) MICROPHONE MEMS DIAPHRAGM AND SELF-TEST THEREOF

(71) Applicant: InvenSense, Inc., San Jose, CA (US)

(72) Inventors: Marek Matej, Bratislava (SK); Stefano Riva, Merate (IT)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 17/158,983

(22) Filed: Jan. 26, 2021

(51) Int. Cl.
*H04R 1/32* (2006.01)
*H04R 7/02* (2006.01)
*B81B 3/00* (2006.01)

(52) U.S. Cl.
CPC .......... *H04R 1/326* (2013.01); *B81B 3/0021* (2013.01); *H04R 7/02* (2013.01); *B81B 2201/0257* (2013.01); *H04R 2201/003* (2013.01)

(58) Field of Classification Search
CPC .... H04R 1/326; H04R 7/02; H04R 2201/003; B81B 3/0021; B81B 2201/0257
USPC ........................................................ 381/173
See application file for complete search history.

(56) References Cited

U.S. PATENT DOCUMENTS

| | | | | |
|---|---|---|---|---|
| 2014/0294218 | A1* | 10/2014 | Suvanto | H04R 1/222 381/337 |
| 2014/0294226 | A1* | 10/2014 | Suvanto | H04R 1/04 381/398 |
| 2015/0281865 | A1* | 10/2015 | Gottlieb | H03G 5/165 381/56 |

* cited by examiner

Primary Examiner — Sean H Nguyen

(57) ABSTRACT

A device includes a micro-electromechanical system (MEMS) element configured to sense acoustic signals. The device also includes a circuitry configured to enable the microphone element to sense the acoustic signals. The circuitry is further configured to disable the microphone element to prevent the microphone element to sense the acoustic signals. It is appreciated that the circuitry is further configured to apply a test signal to the MEMS element when the microphone element is disabled. The microphone element outputs a signal in response to the test signal to the circuitry. The circuitry in response to the output signal with a first value determines that a diaphragm of the MEMS element is nonoperational and the circuitry in response to the output signal with a second value determines that the diaphragm of the MEMS element is operational.

22 Claims, 5 Drawing Sheets

MICROPHONE MEMS DIAPHRAGM AND SELF-TEST THEREOF

BACKGROUND

MEMS ("micro-electro-mechanical systems") are a class of devices that are fabricated using semiconductor-like processes and exhibit mechanical characteristics. MEMS devices may include a membrane with the ability to move or deform in response to a stimuli. A class of microphones utilize a MEMS element that deforms in response to acoustic waves (i.e. sound). The MEMS element may include a stationary plate and movable plate (i.e. a membrane that deforms in response to acoustic waves). The stationary plate and the movable plate form a capacitor that changes capacitance as the membrane deforms, responsive to acoustic waves. Common failures and performance degradation result from damage to the membrane, e.g., diaphragm, of the MEMS element. The diaphragm may be damaged or torn off as a result of acoustic overload, mechanical stress, and/or electrostatic charge, resulting in partial or total loss of microphone acoustic sensitivity.

Conventionally, the MEMS element and its functionality was tested externally, e.g., by applying acoustic waves and if no response is registered then it can be deduced that the membrane has been damaged or torn off. Unfortunately, the device itself is incapable of testing the functionality and health of its membrane/diaphragm.

SUMMARY

Accordingly, a need has arisen for a device with a microphone to perform a self-test to check whether its membrane (i.e. diaphragm) has been damaged or torn off. According to some embodiments, a circuitry may be used to bias the diaphragm of the MEMS microphone by applying a charge, thereby enabling the diaphragm to deform responsive to acoustic waves. The circuitry may unbias the diaphragm of the MEMS microphone during self-test, thereby disabling the diaphragm or reducing its sensitivity to acoustic waves. The circuitry may apply a test signal to the MEMS microphone once the MEMS microphone is unbiased such that it substantially responds to the test signal with minimal interference from acoustic waves. The received output signal from the MEMS microphone is processed by the circuitry and if the signal has a first value (or range) it is determined that the membrane (i.e. diaphragm) is not damaged or torn off and if the signal has a second value (or range) it is determined that the diaphragm is damaged or torn off.

In some embodiments, a device includes a MEMS element configured to sense acoustic signals. The device also includes a circuitry configured to enable the microphone element to sense the acoustic signals. The circuitry is further configured to disable the microphone element to prevent the microphone element to sense the acoustic signals. It is appreciated that the circuitry is further configured to apply a test signal to the MEMS element when the microphone element is disabled. The microphone element outputs a signal in response to the test signal to the circuitry. The circuitry in response to the output signal with a first value determines that a diaphragm of the MEMS element is nonoperational and the circuitry in response to the output signal with a second value determines that the diaphragm of the MEMS element is operational.

It is appreciated that the test signal may be applied to the diaphragm, a backplate, and/or a handle element, of the MEMS element. The diaphragm and the backplate of the MEMS element form a capacitive element when the diaphragm is operational. The handle element is a carrier for a thinner silicon device substrate.

In some embodiments, the circuitry may include a charge pump. The charge pump is configured to bias the MEMS element when the microphone element is enabled. Moreover, the charge pump is configured to unbias the MEMS element when the microphone element is disabled.

It is appreciated that the test signal may be programmable via the circuitry. According to some embodiments, the diaphragm of the MEMS element has a larger amplitude response to the test signal when the diaphragm of the MEMS element is nonoperational in comparison to when the diaphragm of the MEMS element is operational.

According to some embodiments, the device may further include a processing unit configured to initiate a self-test mode. The circuitry disables the microphone element to prevent the microphone element to sense the acoustic waves when the processing unit initiates the self-test mode.

In some embodiments a method includes disabling a microphone element of a MEMS element configured to sense acoustic waves. The method further includes applying a test signal to the MEMS element of the microphone element. In some embodiments, the method further includes receiving an output signal from the MEMS element of the microphone element in response to the test signal. An amplitude response of the output signal is determined. The method further includes determining that a diaphragm of the MEMS element is nonoperational in response to the amplitude response of the output signal being greater than a threshold. According to some nonlimiting examples, the method further includes determining that the diaphragm of the MEMS element is operational in response to the amplitude response of the output signal being lower than the threshold.

It is appreciated that the disabling may include terminating charge application from a charge pump to the MEMS element. In some nonlimiting examples, the applying includes applying the test signal to the diaphragm of the MEMS element. The diaphragm and a backplate of the MEMS element form a capacitive element when the diaphragm is operational. In some embodiments, the test signal may be applied to a backplate of the MEMS element. In some nonlimiting examples, the MEMS element includes a handle element and the test signal is applied to the handle element. It is appreciated that the handle element is a carrier for a thinner silicon device substrate. It is appreciated that the test signal may be programmable. It is appreciated that the amplitude response of the amplitude signal in response to the test signal is larger when the diaphragm of the MEMS element is nonoperational in comparison to when the diaphragm of the MEMS element is operational. The method may further include receiving a signal initiating a self-test mode. The microphone is disabled in response to the received signal to initiate the self-test mode.

These and other features and aspects of the concepts described herein may be better understood with reference to the following drawings, description, and appended claims.

DESCRIPTION

Figure 1A:
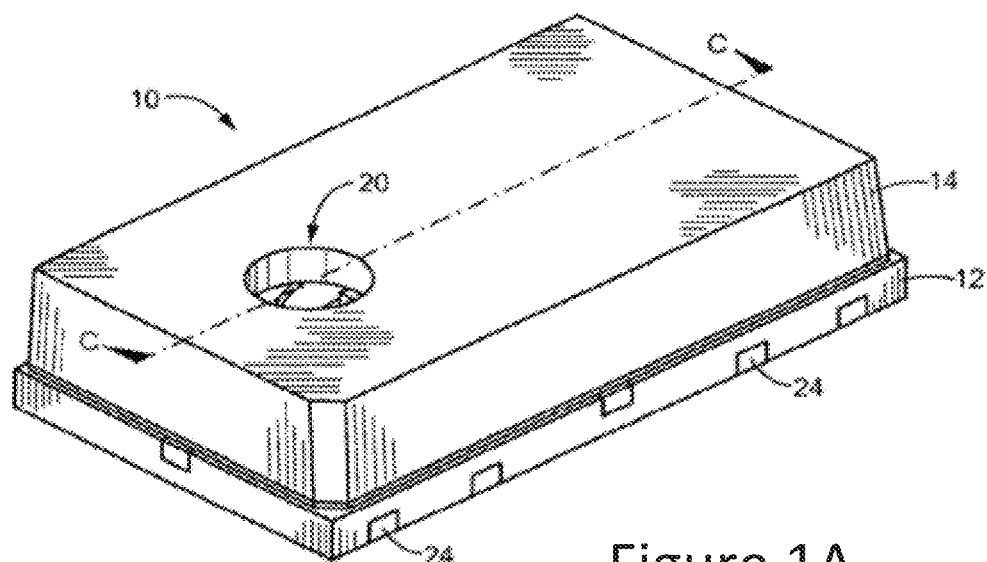
FIG. 1A shows a top perspective view of a packaged microphone having a MEMS microphone die according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," "forming," "formation," "reducing," "applying," "pulling," "bending," "terminating," "detecting," "disabling," "receiving," determining," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

A device having a microphone with a MEMS element that is capable of performing a self-test to check the health and operation of the membrane (i.e. diaphragm). In other words, the device may initiate a self-test automatically or in response to a user selection. Once in self-test mode, it can be determined whether the diaphragm has been damaged or torn off. According to some embodiments, the microphone may include a MEMS element having a backplate, a diaphragm, and a handle. The handle typically refers to a thicker substrate used as a carrier for the thinner silicon device substrate. The diaphragm is configured to deform in response to acoustic waves and together with the backplate (stationary plate) forms a capacitor. As such, the capacitive charges stored changes as the diaphragm moves sensing acoustic waves.

A circuitry such as an application specific integrated circuit (ASIC) may be coupled to the MEMS element. The circuitry during normal operation (i.e. not in self-test mode) biases, e.g., using a charge pump, the MEMS element (the diaphragm) such that the diaphragm is moved in response to acoustic waves. Once in self-test mode, the circuitry unbiases the diaphragm in order to reduce the sensitivity of the diaphragm to acoustic waves. In some embodiments, unbiasing the diaphragm disables the diaphragm from being responsive to acoustic waves.

In self-test mode, the circuitry applies a test signal to the MEMS element, e.g., test signal applied to the diaphragm, test signal applied to the handle, test signal applied to the backplate, or any combination thereof. It is appreciated that the test signal may be programmable, e.g., the value of the test signal (e.g., amplitude, voltage) may change or the shape of the injected signal (e.g., square wave, duty cycle, frequency, etc.) may change, etc. The MEMS element outputs a signal in response to the received test signal. The output signal may be associated with the charges stored (i.e. voltage) on the capacitive element (i.e. backplate and the diaphragm). The circuitry receives and processes the output signal from the MEMS element. If the processed signal is determined to have a first value (nominal value such as less than 10 mV) or range then it is determined that the diaphragm is operational and not damaged and if the processed signal is determined to have a second value (greater than 100 mV) or range then it is determine that the diaphragm is nonoperational. In other words, when the diaphragm is damaged or torn off, a high amplitude levels are experienced when a test signal is applied while lower amplitude levels are experienced when a test signal is applied and when the diaphragm is undamaged.

It is appreciated that the term acoustic waves has been used interchangeably with acoustic/audio signals. It is also appreciated that the term membrane has been used interchangeably with diaphragm throughout this application. FIGS. 1A-1D and 2 are directed to general discussions regarding a MEMS element in a microphone while FIGS. 3-7 describe the architectural and process steps of self-test to determine whether a diaphragm of the MEMS element is damaged or torn off.

FIG. 1A shows a top perspective view of a packaged microphone 10 having a MEMS microphone die 16 (shown in FIGS. 1C, 1D, and 2) according to one aspect of the present embodiments.

The packaged microphone 10 shown has a package base 12 that, together with a corresponding lid 14, forms an interior chamber containing a microphone chip 16 and, if desired, a separate microphone circuit chip 18 (both dies 16 and 18 are shown schematically in FIGS. 1C and 1D and discussed below). The lid 14 in this embodiment is a cavity-type lid, which has four walls extending generally orthogonally from a top, interior face to form a cavity. In illustrative embodiments, the lid 14 is formed from metal or other conductive material to shield the microphone die 16 from electromagnetic interference. The lid 14 secures to the top face of the substantially flat package base 12 to form the interior chamber.

The lid 14 also has an audio input port 20 that enables ingress of acoustic waves (i.e. audio signals) into the chamber. In alternative embodiments, however, the audio port 20 is at another location, such as through the package base 12, or through one of the side walls of the lid 14. Audio signals entering the interior chamber interact with the microphone chip 16 to produce an electrical signal that, with additional (exterior) components (e.g., a speaker and accompanying circuitry), produce an output audible signal corresponding to the input audible signal.

Figure 1B:
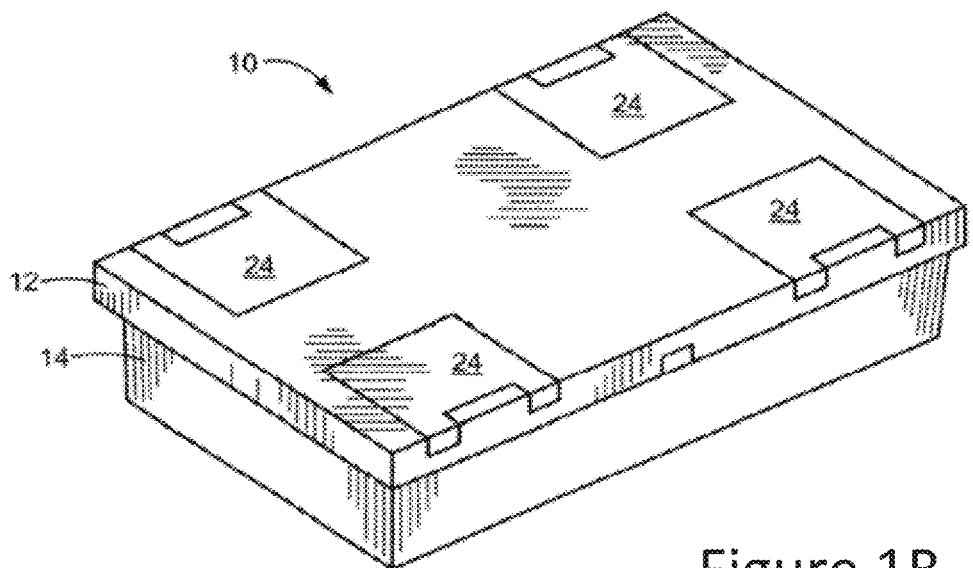
FIG. 1B shows a bottom perspective view of the packaged microphone in FIG. 1A.

FIG. 1B shows a bottom face 22 perspective view of the packaged microphone in FIG. 1A. The bottom face 22 of the package base 12, has a number of contacts 24 for electrically (and physically, in many anticipated uses) connecting the microphone die 16 with a substrate, such as a printed circuit board or other electrical interconnect apparatus. The packaged microphone 10 may be used in any of a wide variety of applications. For example, the packaged microphone 10 may be used with mobile telephones, land-line telephones, computer devices, video games, hearing aids, hearing instruments, biometric security systems, two-way radios, public announcement systems, and other devices that transduce signals. In fact, it is anticipated that the packaged microphone 10 could be used as a speaker to produce audible signals from electronic signals.

In illustrative embodiments, the package base 12 may be a printed circuit board material, such as FR-4, or a pre-molded, leadframe-type package (also referred to as a "pre-molded package"). Other embodiments may use different package types, such as ceramic cavity packages. Accordingly, discussion of a specific type of package is for illustrative purposes only.

Figure 1C:
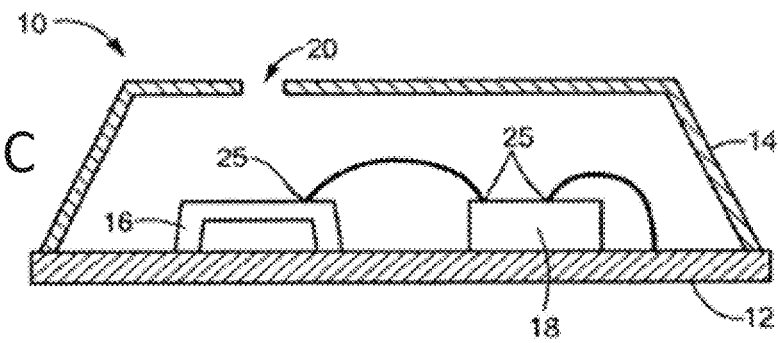
FIG. 1C shows a cross-sectional view of the packaged microphone oriented as in FIG. 1A.
Figure 1D:
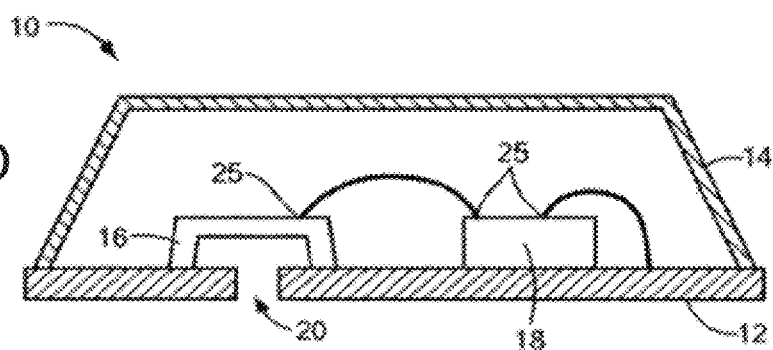
FIG. 1D shows a cross-sectional view of a similar packaged microphone having a bottom port according to one aspect of the present embodiments.

FIG. 1C shows a cross-sectional view of the packaged microphone 10 oriented across line C-C of FIG. 1A. As shown and noted above, the lid 14 and base 12 form the noted internal chamber for containing a MEMS microphone die 16 and electronics 18 used to control and drive the microphone die 16. In illustrative embodiments, electronics are implemented as a second, stand-alone integrated circuit, such as an application specific integrated circuit ("ASIC 18"). Other embodiments, however, may form the MEMS microstructure and electronic circuitry on a single die.

Adhesive or another fastening mechanism secures both the microphone die 16 and ASIC die 18 to the base 12. Wire bonds electrically connect the microphone die 16 and ASIC die 18 to contact pads (not shown) on the interior of the package base 12.

While a top port packaged microphone design has been illustrated, some embodiments position the input port at other locations, such as through the base 12. For example, FIG. 1D schematically shows a cross-sectional view of a similar packaged microphone 10 where the microphone die 16 covers the input port, consequently producing a large back volume. Other embodiments, not shown, position the microphone die 16 so that it does not cover the input port 20 through the base 12. Discussion of a specific packaged microphone is for illustrative purposes only. Accordingly, the packaged microphone 10 discussed with regard to FIGS. 1A-1D are not intended to limit all embodiments of the invention.

Figure 2:
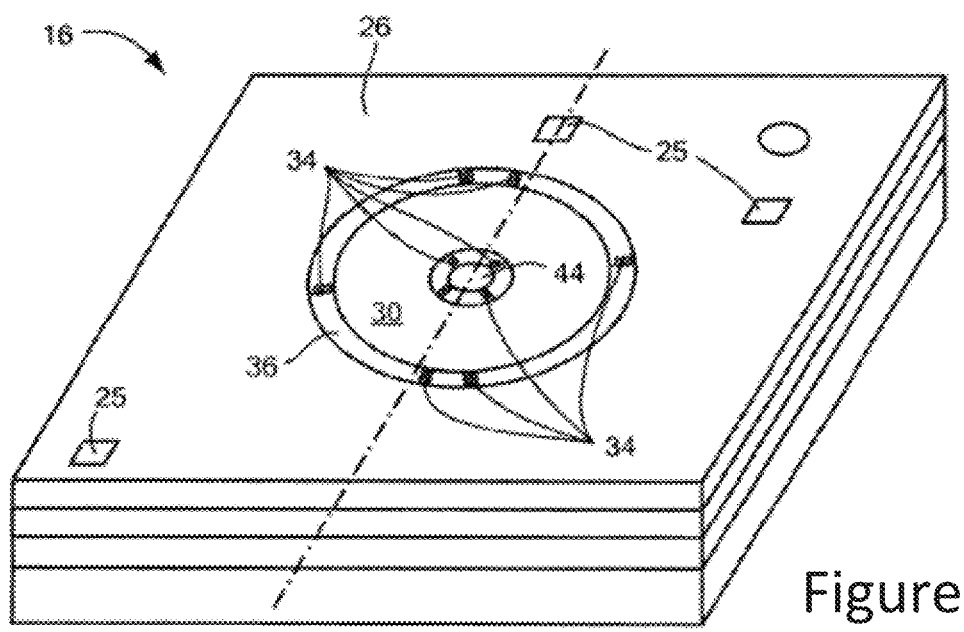
FIG. 2 shows a MEMS microphone die according to one aspect of the present embodiments.

FIG. 2 shows a MEMS microphone die 16 (also referred to as a "microphone chip") according to one aspect of the present embodiments. Among other things, the microphone die 16 includes a stationary portion 26 that supports and forms a variable capacitor 28 with a flexible diaphragm 30.

In illustrative embodiments, the stationary portion 26 includes a backplate 32 (shown in subsequent figures and discussed below) formed from single crystal silicon (e.g., the top layer of a silicon-on-insulator wafer, discussed below) and other deposited layers, while the diaphragm 30 is formed from a deposited material only, such as deposited polysilicon. Other embodiments, however, use other types of materials to form the stationary portion 26 and the diaphragm 30. For example, a single crystal silicon bulk wafer, and/or some deposited material, may form the stationary portion 26. In a similar manner, a single crystal silicon bulk wafer, part of a silicon-on-insulator wafer, or some other deposited material may form the diaphragm 30. It is appreciated that the stationary portion 26 of the microphone die 16 has a backplate 32 that, together with the diaphragm 30, may form a variable capacitor. The diaphragm 30 deforms in response to acoustic waves, causing the variable capacitor to change capacitive charges stored thereon.

Springs 34 movably and integrally connect the outer periphery of the diaphragm 30 to the stationary portion 26 of the microphone die 16. The springs 34 effectively form a plurality of apertures 36 that permit at least a portion of the audio/acoustic signal to pass through the diaphragm 30. These apertures 36, which also may be referred to as "diaphragm apertures 36," may be any shape as required by the application, such as in the shape of a slot, round hole, or some irregular shape. Electrical contacts 25 on the top face of the dies 16 and 18 provide electrical connection for the wire bonds shown in FIGS. 1C and 1D.

Figure 3:
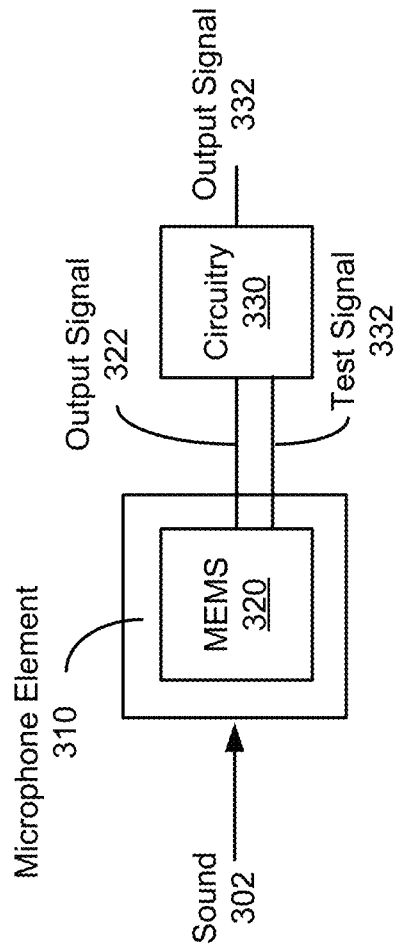
FIG. 3 shows a device including a MEMS microphone with self-test capability according to some embodiments.

FIG. 3 shows a device including a MEMS microphone with self-test capability according to some embodiments. A microphone element 310 may include a MEMS element 320, e.g., backplate, diaphragm, and handle. The diaphragm of the MEMS element 320 may deform in response to sound 302 (also referred to as acoustic waves). The MEMS element 320 outputs signal 322 in response the diaphragm moving. The circuitry 330 receives and processes the acoustic analog signal 322 to generate acoustic signal such as output signal 332.

According to some embodiments, the circuitry 330 may initiate a self-test mode to test the health of the diaphragm of the MEMS element320. It is appreciated that the self-test may be initiated automatically or in response to a user selection thereof. In self-test mode, the circuitry 330 unbias the diaphragm of the MEMS element 320 (or lower the MEMS bias voltage) in order to reduce its sensitivity to acoustic waves (or to disable its response to acoustic waves). In other words, interference from acoustic waves is reduced.

Figure 4:
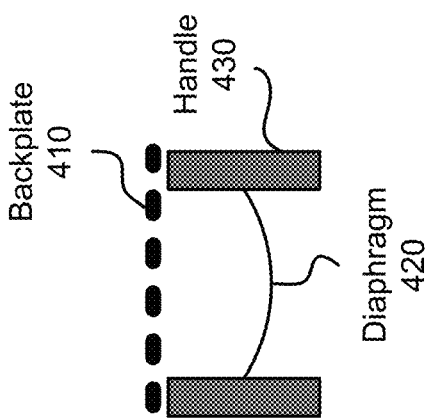
FIG. 4 shows a MEMS element according to some embodiments.

Once unbiased, the diaphragm of the MEMS element 320 becomes substantially insensitive to the acoustic wave 302. The circuitry 330 may transmit a test signal 332 to the MEMS element 320. The test signal 332 may be programmable. For example, the amplitude of the test signal 332 may change, the duty cycle may be adjusted, the frequency may be modified, the shape may be adjusted (e.g., square wave as opposed to a sinusoidal wave), etc. The test signal 332 may be applied to one or more location of the MEMS element 320. For example, referring now to FIG. 4 shows a MEMS element 320 according to some embodiments. In this nonlimiting example, the MEMS element 320 may include a backplate 410, a diaphragm 420, and a handle 430. As discussed above, the handle 430 wafer typically refers to a thicker substrate used as a carrier for the thinner silicon device substrate, e.g., diaphragm 420. The diaphragm 420 and the backplate 410 form a capacitor. The diaphragm 420 moves and deforms in response to a stimuli, e.g., sound 302, test signal 332, etc. Referring back to FIG. 3, the test signal 332 may be applied to the backplate 410, the diaphragm 420, and/or the handle 430. The MEMS element 320 outputs signal 322 in response to the test signal 332.

The circuitry 330 receives the output signal 322 and processes it, e.g., amplified, lowpass/bandpass filter, etc. Once processed, the circuitry 330 may determine whether the diaphragm 420 of the MEMS element 320 is damaged. In general, a higher amplitude response from the MEMS element 320 is associated with damaged diaphragm 420 whereas a lower amplitude is associated with undamaged diaphragm 420. As such, in some embodiments the output signal 322 processed as having an amplitude less than 10 mV may be associated with undamaged diaphragm 420 and one having an amplitude greater than 100 mV may be associated with damaged diaphragm 420. Accordingly, the circuitry 330 may output 332 signal, e.g., a binary value, indicating whether the diaphragm 420 is damaged or undamaged. In operational and not in self-test mode the output signal 332 may be the output acoustic analog signal as detected by the microphone element 310.

Figure 5:
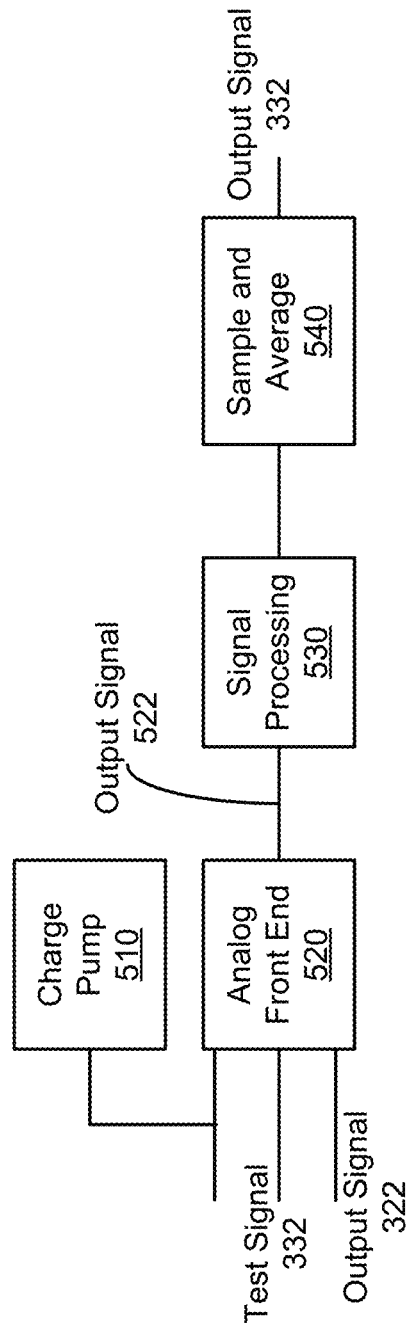
FIG. 5 shows a circuitry initiating a self-test for the MEMS microphone according to some embodiments.

Referring now to FIG. 5, a circuitry 330 initiating a self-test for the MEMS microphone according to some embodiments is shown. In this nonlimiting example, the circuitry 330 may include a charge pump 510, an analog front end 520 unit, a signal processing 530 unit, and a sample and average 540 unit. As discussed above, during operational mode (i.e. not in self-test mode), the MEMS element 320 of the microphone is biased in order to increase its sensitivity to acoustic waves. As such, the charge pump 510 may apply charges to the MEMS element 320 in order to bias the MEMS element 320. The sensed acoustic signals by the MEMS element 320 is acoustic analog signal 322 as received by the analog front end 520 unit. The acoustic analog signal 322 is processed by the signal processing 530 unit and subsequently sampled and averaged by the sample and average 540 unit to generate the output signal 332 (i.e. audio output).

In self-test mode, a processor (not shown) may send a notification signal to the microphone element 310 that the device is entering a self-test mode. In self-test mode, the MEMS element 320 is unbiased to reduce its sensitivity to acoustic waves. As such, the charge pump 510 does not apply charges to the MEMS element 320 once in self-test mode. The analog front end 520 may apply a test signal 332 (as described above) to the MEMS element 320. The test signal 332 may be applied to one or more locations of the MEMS element 320, e.g., backplate 410, diaphragm 420, and/or handle 430, therefore creating a voltage across the capacitive element (if the diaphragm 420 is undamaged). In response to the test signal 332, the MEMS element 320 generates an acoustic analog signal 322. The acoustic analog signal 322 is received by the analog front end 520 unit. In some nonlimiting examples, the analog front end 520 may include a filter, e.g., low pass filter, bandpass filter, etc. The filtered signal may be inversely proportional to the capacitance of the capacitive element when in self-test mode. As such, a small amplitude is generated as the acoustic output signal 522 when the capacitive element (i.e. backplate 410 and diaphragm 420) is undamaged. Conversely, a large amplitude is generated as the acoustic output signal 522 when the capacitive element is damaged.

In some embodiments, the acoustic output signal 522 is processed by the signal processing 530 unit as well as being sampled and averaged by the sample and average 540 unit. It is appreciated that the signal processing 530 unit and the sample and average 540 unit may be integrated within the analog front end 520 is some nonlimiting examples. It is appreciated that the sample and average 540 unit may be used to make the determination of whether the diaphragm 420 is damaged or undamaged statistically significant. Moreover, it is appreciated that the signal processing unit 530 and/or the sample and average 540 unit may be used to convert the analog signal(s) to digital signal(s).

The signal processing 530 unit may determine whether the diaphragm 420 of the MEMS 320 element is undamaged based on the amplitude. For example, for amplitudes less than 10 mV it may be determined that the diaphragm 420 is undamaged, and for amplitudes greater than 100 mV it may be determined that the diaphragm 420 is damaged. According to some embodiments, the test signal 332 may be a plurality of signals injected in a particular frequency. As such, a determination (i.e. pass/fail of the diaphragm 420) may be made for each test signal and sampled and averaged in order to make the determination of pass/fail in a more statistically significant fashion. It is appreciated that in some embodiments, the output signal of the signal processing 530 unit may be sampled and averaged by the sample and average 530 unit over several periods of test signal 332. The sampled and averaged value may be compared to a first threshold value (e.g., less than 10 mV) to determine that the diaphragm 420 is undamaged and comparing it to a second threshold value (e.g., greater than 100 mV, greater than 10 mV, etc.) to determine that the diaphragm 420 is damaged. The output signal 332 in self-test mode is a determination of whether the diaphragm 420 is damaged or undamaged. It is appreciated that the threshold values may be digitally programmable thresholds.

Figure 6:
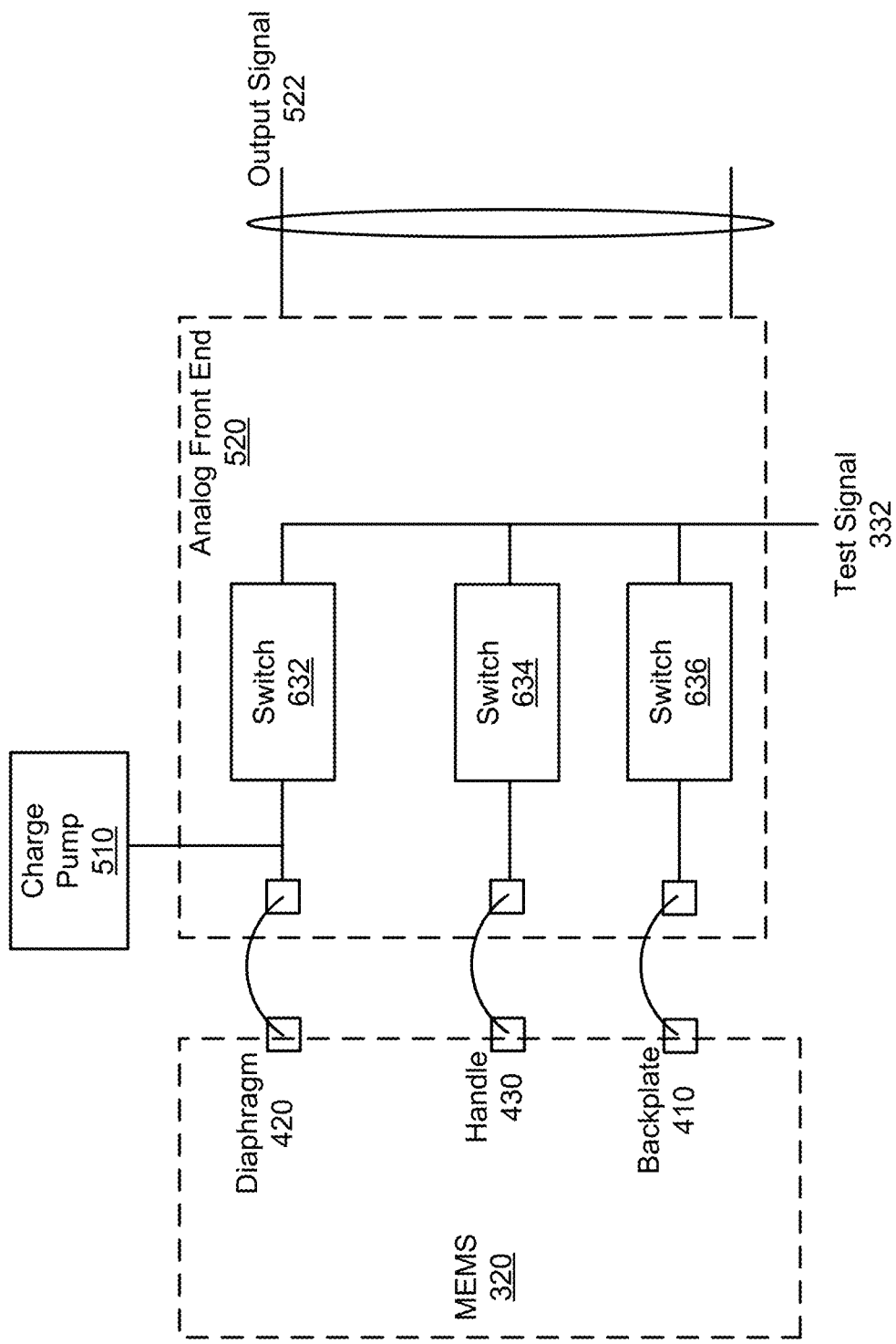
FIG. 6 shows an analog front end circuitry applying a test signal during self-test to a MEMS element according to some embodiments.

Referring now to FIG. 6, an analog front end circuitry applies a test signal during self-test to a MEMS element according to some embodiments. The analog front end 520 may include switches 632, 634, and 636 to operatively couple the test signal 332 to the desired element of the MEMS 320 element. For example, when the switch 632 is turned on during self-test mode, the test signal 332 is applied to the diaphragm 420. Similarly, when the switch 634 is turned on during self-test mode, the test signal 332 is applied to the handle 430. In some nonlimiting examples, when the switch 636 is turned on during self-test mode, the test signal 332 is applied to the backplate 410. It is appreciated that more than one switch may be turned on at the same time, e.g., test signal 332 may be applied to both the diaphragm 420 and the backplate 410 if the switches 632 and 636 are turned on at the same time. It is appreciated that the embodiments are described above with respect to a differential signal output. However, it is appreciated that the embodiments should not be construed as limited thereto. For example, a single ended signal may be used. It is appreciated that the diaphragm and the backplate of the MEMS element forms a capacitive element when the diaphragm is operational. It is appreciated that in some embodiments, the test signal may be applied to the diaphragm of the MEMS element. In some nonlimiting examples, the test signal may be applied to the backplate of the MEMS element. In yet another nonlimiting example, the test signal may be applied to the handle (i.e. carrier for a thinner silicon device substrate) element of the MEMS. It is appreciated that the test signal may have a shape, a frequency and an amplitude. For example, the test signal may be a square wave, a triangular wave, or a sinusoidal wave with a frequency ranging between 10 Hz to 10 MHz and an amplitude between 10 mVpeak to 10 Vpeak.

Figure 7:
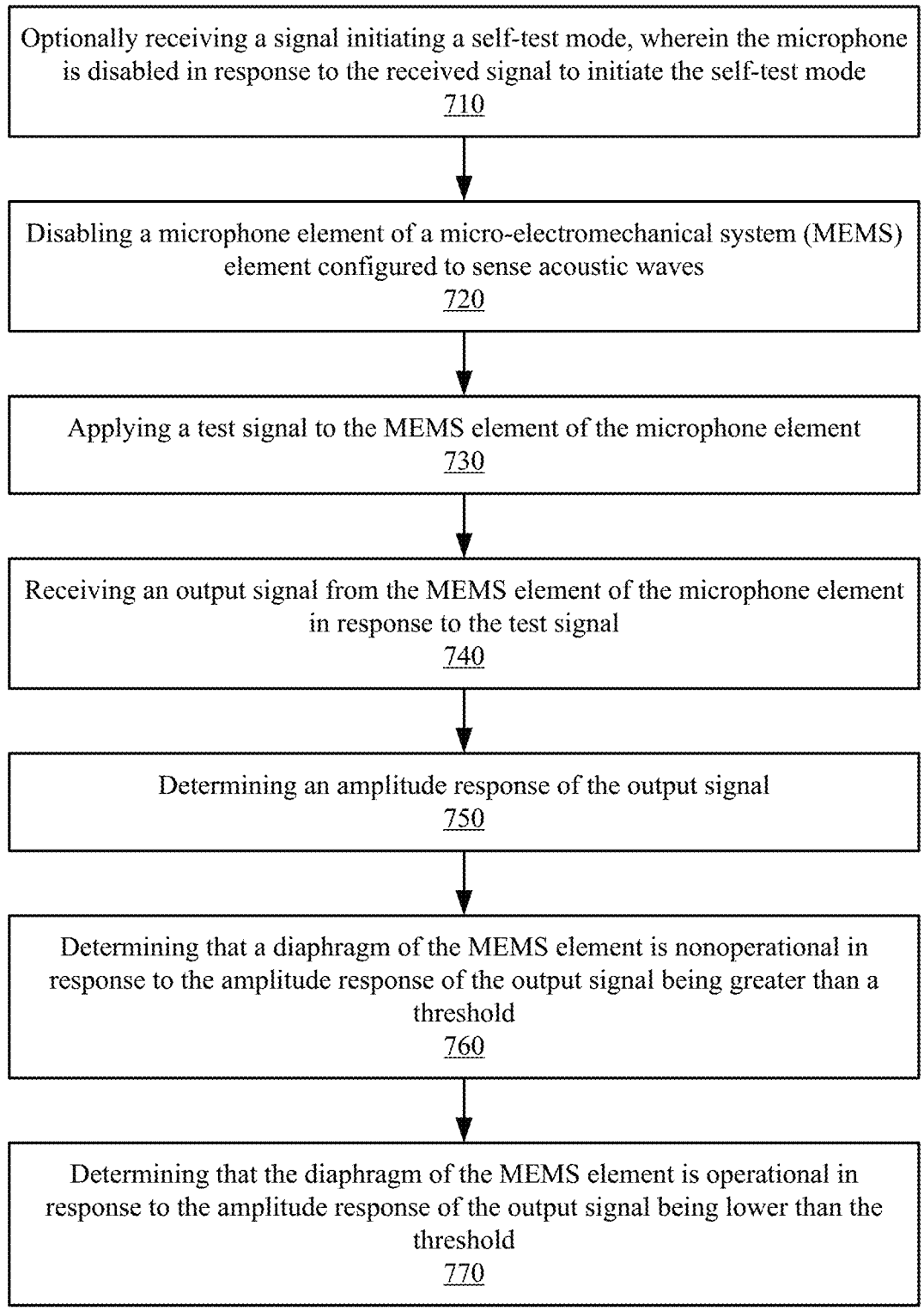
FIG. 7 shows a method of performing a self-test for the MEMS microphone according to one aspect of the present embodiments.

FIG. 7 shows a method of performing a self-test for the MEMS microphone according to one aspect of the present embodiments. At step 710, optionally, a signal initiating a self-test mode may be received, e.g., from a processor, initiated by the user, etc. At step 720, the microphone element configured to sense acoustic waves may be disabled. In other words, the sensitivity of the MEMS 320 element to acoustic waves may be reduced, e.g., by unbiasing the MEMS 320 element. At step 730, a test signal is applied to the MEMS element of the microphone element. In response to the test signal, an output signal is received from the MEMS element of the microphone element at step 740. At step 750, an amplitude response of the output signal is determined. At step 760, it is determined that the diaphragm of the MEMS element is nonoperational in response to the amplitude response of the output signal being greater than a first threshold value. At step 770, it is determined that the diaphragm of the MEMS element is operational in response to the amplitude response of the output signal being less than a second threshold value.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above, and other implementations are within the scope of the following claims.

What is claimed is:

1. A device comprising:
 a microphone element comprising a micro-electromechanical system (MEMS) element configured to sense acoustic waves; and
 a circuitry configured to enable the microphone element to sense the acoustic waves and the circuitry is further configured to disable the microphone element to prevent the microphone element to sense the acoustic waves, and wherein the circuitry is further configured to apply a test signal to the MEMS element when the microphone element is disabled,
 wherein the microphone element outputs a signal in response to the test signal to the circuitry, and wherein the circuitry in response to the output signal greater than a first threshold value determines that a diaphragm of the MEMS element is nonoperational and wherein the circuitry in response to the output signal less than a second threshold value determines that the diaphragm of the MEMS element is operational.

2. The device of claim 1, wherein the test signal is applied to the diaphragm of the MEMS element, wherein the diaphragm and a backplate of the MEMS element form a capacitive element when the diaphragm is operational.

3. The device of claim 1, wherein the test signal is applied to a backplate of the MEMS element, wherein the diaphragm and the backplate of the MEMS element form a capacitive element when the diaphragm is operational.

4. The device of claim 1, wherein the MEMS element includes a handle element and wherein the test signal is applied to the handle element, and wherein the handle element is a carrier for a thinner silicon device substrate.

5. The device of claim 1, wherein the circuitry further includes a charge pump and wherein the charge pump is configured to bias the MEMS element when the microphone element is enabled, and wherein the charge pump is configured to unbias the MEMS element when the microphone element is disabled.

6. The device of claim 1, wherein the test signal is programmable via the circuitry.

7. The device of claim 1, wherein the test signal is a square wave with a frequency ranging between 10 Hz to 10 MHz and an amplitude between 10 mVpeak to 10 Vpeak.

8. The device of claim 1, wherein the diaphragm of the MEMS element has a larger amplitude response to the test signal when the diaphragm of the MEMS element is nonoperational in comparison to when the diaphragm of the MEMS element is operational.

9. The device of claim 1 further comprising a processing unit configured to initiate a self-test mode, wherein the circuitry disables the microphone element to prevent the microphone element to sense the acoustic waves when the processing unit initiates the self-test mode.

10. A method comprising:
 disabling a microphone element of a micro-electromechanical system (MEMS) element configured to sense acoustic waves;
 applying a test signal to the MEMS element of the microphone element;
 receiving an output signal from the MEMS element of the microphone element in response to the test signal;
 determining an amplitude response of the output signal; and
 determining that a diaphragm of the MEMS element is nonoperational in response to the amplitude response of the output signal being greater than a first threshold value.

11. The method of claim 10, wherein the applying includes applying the test signal to the diaphragm of the MEMS element, wherein the diaphragm and a backplate of the MEMS element form a capacitive element when the diaphragm is operational.

12. The method of claim 10, wherein the test signal is applied to a backplate of the MEMS element, wherein the diaphragm and the backplate of the MEMS element form a capacitive element when the diaphragm is operational.

13. The method of claim 10, wherein the MEMS element includes a handle element and wherein the test signal is applied to the handle element, and wherein the handle element is a carrier for a thinner silicon device substrate.

14. The method of claim 10, wherein the test signal is programmable.

15. The method of claim 10, wherein the amplitude response of the amplitude signal in response to the test signal is larger when the diaphragm of the MEMS element is nonoperational in comparison to when the diaphragm of the MEMS element is operational.

16. The method of claim 10 further comprising receiving a signal initiating a self-test mode, wherein the microphone is disabled in response to the received signal to initiate the self-test mode.

17. The method of claim 10 further comprising determining that the diaphragm of the MEMS element is operational in response to the amplitude response of the output signal being lower than a second threshold value.

18. The method of claim 10, wherein the test signal is a sinusoidal wave with a frequency ranging between 10 Hz to 10 MHz and an amplitude between 10 mVpeak to 10 Vpeak.

19. A device comprising:
a microphone element comprising a micro-electromechanical system (MEMS) element configured to sense acoustic waves; and
a circuitry configured to enable the microphone element to sense the acoustic waves and the circuitry is further configured to disable the microphone element to prevent the microphone element to sense the acoustic waves when in self-test mode, wherein the circuitry comprises a plurality of switches configured to apply a test signal to a plurality of test positions of the MEMS element when the microphone element is disabled,
wherein the microphone element outputs a signal in response to the test signal to the circuitry, and wherein the circuitry in response to the output signal with a first value determines that a diaphragm of the MEMS element is nonoperational and wherein the circuitry in response to the output signal with a second value determines that the diaphragm of the MEMS element is operational.

20. The device of claim 19, wherein the plurality of test positions includes the diaphragm of the MEMS element, a backplate of the MEMS element that forms a capacitive element when the diaphragm is operational, and a handle element and wherein the test signal is applied to the handle element, and wherein the handle element is a carrier for a thinner silicon device substrate.

21. The device of claim 19, wherein the test signal is programmable.

22. The device of claim 19, wherein the test signal is a triangular wave with a frequency ranging between 10 Hz to 10 MHz and an amplitude between 10 mVpeak to 10 Vpeak.

* * * * *